United States Patent
Buchhold

(10) Patent No.: US 7,492,150 B2
(45) Date of Patent: Feb. 17, 2009

(54) CIRCUIT ARRANGEMENT METHOD FOR OBTAINING AN OUTPUT SIGNAL, AND ROTATIONAL SPEED MEASUREMENT DEVICE COMPRISING SUCH A CIRCUIT ARRANGEMENT

(75) Inventor: Reinhard Buchhold, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/560,451

(22) PCT Filed: Jun. 3, 2004

(86) PCT No.: PCT/IB2004/050833

§ 371 (c)(1),
(2), (4) Date: Feb. 26, 2008

(87) PCT Pub. No.: WO2004/111658

PCT Pub. Date: Dec. 23, 2004

(65) Prior Publication Data

US 2008/0143322 A1    Jun. 19, 2008

(30) Foreign Application Priority Data

Jun. 18, 2003   (EP) ................... 03101786

(51) Int. Cl.
*G01R 33/09* (2006.01)
*G01B 7/30* (2006.01)

(52) U.S. Cl. ............... 324/207.21; 324/207.25; 324/252

(58) Field of Classification Search .......... 324/160, 324/166–167, 173, 207.21, 207.25, 252; 73/514.16, 514.31, 514.39
See application file for complete search history.

(56) References Cited

U.S. PATENT DOCUMENTS 3,808,543 A * 4/1974 Mueller ................. 377/45
4,359,688 A * 11/1982 Haville ................. 327/120
5,663,643 A * 9/1997 Matuyama ............ 324/207.12

* cited by examiner

Primary Examiner—Bot LeDynh
(74) Attorney, Agent, or Firm—Peter Zawilski

(57) ABSTRACT

A circuit arrangement for obtaining an output signal (Va) form a signal (Vs) containing at least one alternating component comprises a signal source (1) that supplies this signal (Vs), a first peak value detection device (2) for determining a maximum value (Vmax) of the signal (Vs), a second peak value detection device (3) for determining a minimum value (Vmin) of the signal (Vs), a first signal linking device (4, 5, 6, 71) for obtaining a first resulting signal (V1) by additive linking of the signal (Vs), the maximum value (Vmax) and the minimum value (Vmin) in accordance with the rule: $V1=K1*\{Vs-(Vmax+Vmin)/2\}$, in which K1 is a freely selectable first constant factor, a second signal linking device (7, 72) for obtaining a second resulting signal (V2) by additive linking of the maximum value (Vmax) and a minimum value (Vmin) in accordance with the rule: $V2=(Vmax-Vmin)*K2$, in which K2 is a freely selectable second factor, a first squaring device (8) for squaring the first resulting signal (V1), a second squaring device (9) for squaring the second resulting signal (V2) and a third signal linking device (100, 11, 101) for obtaining the output signal (Va) by additive linking of the squared first resulting signal ($(V1)^2$) and the squared second resulting signal ($(V2)^2$) in accordance with the rule: $Va=K3*\{(1/8)*(K1/K2)^2*(V2)^2-(V1)^2\}$, in which K3 is a freely selectable third constant factor. By means of the invention, which furthermore includes a rotational speed measurement device comprising such a circuit arrangement and also a method of obtaining an output signal, an unchanged or increased resolution of the output signal can be achieved from the signal containing an alternating component having a restricted resolution.

5 Claims, 3 Drawing Sheets

CIRCUIT ARRANGEMENT METHOD FOR OBTAINING AN OUTPUT SIGNAL, AND ROTATIONAL SPEED MEASUREMENT DEVICE COMPRISING SUCH A CIRCUIT ARRANGEMENT

This is a 371 national phase application of PCT/IB2004/050833, filed 03 Jun. 2004, which claims priority to EPO Patent Application Ser. No. 03101786.6, filed 18 Jun. 2003, the content of which is incorporated herein by reference.

The invention relates to a circuit arrangement for obtaining an output signal from a signal containing at least one alternating component. The invention furthermore relates to a rotational speed measurement device comprising such a circuit arrangement and to a method of obtaining an output signal from a signal containing at least one alternating component.

An arrangement for measuring rotational speeds comprising a magnetoresistive magnetic field sensor and a magnetic or magnetizable gearwheel used as encoder, which supplies a virtually sinusoidal output voltage, is known from the document "Technical Information TI 861105", published under the title "Uses of magnetic field sensors KMZ 10", from the company Valvo, May 11, 1986, Section 5.6 and associated drawing 33. With the number of teeth of the gearwheel and hence of magnetic poles of the encoder, the temporal resolution of the output voltage can also be increased during movement of the encoder, and this is particularly important when detecting the rotational speed of the wheels in antiblocking systems (ABS).

As the modules used in such arrangements for measuring rotational speed are being miniaturized, the encoders, e.g. gearwheels, that are to be sampled by the sensor are also becoming increasingly small. If the number of teeth, i.e. the magnetic poles of the encoder, is kept unchanged in order to keep the resolution of the output voltage constant during movement of the encoder, the size of the teeth or the tooth pitch, which is referred to more generally as the modulus of the encoder, must likewise be made smaller. As a result, however, the magnetic field strengths which are available for signal generation in the magnetic field sensor are also reduced. In order to compensate this reduction, the distance between the encoder and the magnetic field sensor—often designed as an air gap—likewise has to be reduced.

However, such a reduction in the air gap is not acceptable in most applications. For instance, in the case of a rotational speed sensor for an antiblocking system, a reduced air gap would lead to increased demands on the manufacturing tolerances on the one hand and also to greater mechanical sensitivity and fault liability. In spite of the encoder being made smaller, therefore, the modulus of the encoder must not be made smaller. A reduction in the size of the encoder can thus only be achieved if the number of teeth, i.e. the magnetic poles of the encoder, is reduced. However, this means an undesirable reduction in the resolution of the output voltage of the magnetic field sensor during movement of the encoder, since a magnetic pole of the encoder then represents a larger rotation angle of the latter.

It is an object of the invention to provide a circuit arrangement for obtaining an output signal from a signal containing at least one alternating component, which circuit arrangement can be used to achieve an at least unchanged or increased resolution of the output signal while having a restricted resolution of the signal containing an alternating component. It is furthermore an object of the invention to provide a rotational speed measurement device comprising such a circuit arrangement and also a method of obtaining such an output signal from a signal containing at least one alternating component.

According to the invention, this object is achieved by a circuit arrangement for obtaining an output signal from a signal containing at least one alternating component, said circuit arrangement comprising a signal source that supplies this signal, a first peak value detection device for determining a maximum value of the signal, a second peak value detection device for determining a minimum value of the signal, a first signal linking device for obtaining a first resulting signal by additive linking of the signal, the maximum value and the minimum value in accordance with the rule $$V1 = K1 * \{Vs - (Vmax + Vmin)/2\},$$

in which K1 is a freely selectable first constant factor, a second signal linking device for obtaining a second resulting signal by additive linking of the maximum value and minimum value in accordance with the rule $$V2 = (Vmax - Vmin) * K2,$$

in which K2 is a freely selectable second constant factor, a first squaring device for squaring the first resulting signal, a second squaring device for squaring the second resulting signal and a third signal linking device for obtaining the output signal by additive linking of the squared first resulting signal and the squared second resulting signal in accordance with the rule $$Va = K3 * \{(1/8) * (K1/K2)^2 * (V2)^2 - (V1)^2\},$$

in which K3 is a freely selectable third constant factor.

In this case, Vs is the signal containing at least one alternating component, Vmax is the maximum value thereof and Vmin is the minimum value thereof, V1 is the first resulting signal, V2 is the second resulting signal and Va is the output signal.

The invention is based on the knowledge that by squaring a signal containing an alternating component, in particular a signal containing an at least largely harmonic alternating component, a doubling of the frequency can be achieved such that the squared signal contains a signal component with twice the frequency of said alternating component, referred to herein below also as the harmonic wave. In this case, however, account must be taken of the difficulty caused by the fact that offset components in the signal, during squaring of the latter, produce an additional component having the frequency of said alternating component, referred to herein below also as the fundamental wave. However, it is very difficult to separate fundamental wave and harmonic wave in such a squared signal, particularly if the frequency of the alternating component varies, as is the case for example in an application in the abovementioned arrangements for measuring rotational speed.

The circuit arrangement and the method according to the invention overcome these difficulties in a simple manner. Accordingly, prior to squaring, a compensation of the offset components in the signal is carried out so that no fundamental wave is produced by the squaring. Constant components remaining in the signal produced by squaring are then removed so that only a harmonic wave is obtained as output signal. The invention furthermore has the advantage that the signal processing steps according to the invention are independent of the frequency of said alternating component of the signal. The output signal is thus generated for all frequencies down to zero with the same reliability. In one application for processing signals supplied by an arrangement for measuring rotational speeds, this means that the circuit arrangement according to the invention and the method according to the invention still provide perfect results even at very low rotational speeds down to a stop. This is highly important for use in safety-related applications or especially in vehicle technology.

The advantages provided by the invention could not be achieved by conventional separation of the constant and alternating components of a signal using capacitive couplings in a signal processing path. Firstly, a capacitive coupling is always frequency-dependent and requires, for the processing of signals even of low frequencies necessary here, very large capacitors which do not allow for a compact design. Moreover, a capacitive separation of the constant and alternating components of a signal could not on its own solve the problem caused by making the encoder smaller. Furthermore, it is not possible for a distinction to be made between the fundamental wave and the harmonic wave by means of a capacitive coupling without the need for additional filterings.

In this case, the invention is not limited to a supplying of the signal containing at least one alternating component by a magnetoresistive magnetic field sensor. Rather, it can be used universally wherever there is a desire for a doubling of the frequency of a signal with high reliability over a wide frequency range and with a low outlay. One preferred field of application is in sensor technology and in particular in the evaluation of sensor signals.

Accordingly, according to one advantageous refinement of the invention, the signal source is formed by a sensor device. This sensor device is preferably designed as a magnetoresistive sensor device, e.g. as a so-called conventional AMR magnetometer bridge. The encoders used in collaboration with the invention may be passive or active encoders, with or without intrinsic magnetization. Other magnetoelectric converters, such as Hall elements for example, may also be used as signal source for the signal containing at least one alternating component.

According to the invention, a rotational speed measurement device is advantageously designed with a circuit arrangement of the type according to the invention as described above. A good resolution of the measured rotational speed can thereby be achieved, even given a very compact design, particularly of the encoder.

A method according to the invention for obtaining an output signal from a signal containing at least one alternating component advantageously comprises the following method steps:

determining a maximum value of the signal,
determining a minimum value of the signal,
obtaining a first resulting signal by additive linking of the signal, the maximum value and the minimum value in accordance with the rule $V1=K1*\{Vs-(Vmax+Vmin)/2\}$, obtaining a second resulting signal by additive linking of the maximum value and minimum value in accordance with the rule $V2=(Vmax-Vmin)*K2$, squaring the first resulting signal,
squaring the second resulting signal and
obtaining the output signal by additive linking of the squared first resulting signal and the squared second resulting signal in accordance with the rule $Va=K3*\{(1/8)*(K1/K2)^2*(V2)^2-(V1)^2\}$.

In this case, in the above equations Vs is the signal containing at least one alternating component, Vmax is the maximum value thereof and Vmin is the minimum value thereof, V1 is the first resulting signal, V2 is the second resulting signal, Va is the output signal and K1, K2 and K3 are freely selectable first, second and third constant factors, respectively.

An expansion of the circuit arrangement according to the invention moreover makes it possible, in a simple manner, for the frequency to be multiplied by correspondingly providing multiple devices, particularly the combination of first peak value detection device, second peak value detection device, first signal linking device and first squaring device, these combinations being linked to one another in a ladder network. In this ladder network, the signal is alternately freed of offset and constant components and the remaining alternating component is squared. In an accordingly designed method, the signal processing steps determining a maximum value of the signal,
determining a minimum value of the signal,
obtaining a first resulting signal by additive linking of the signal, the maximum value and the minimum value in accordance with a rule of the form $V1=K1*\{Vs-(Vmax+Vmin)/2\}$ and squaring the first resulting signal
are carried out as often as accordingly necessary. Only at the last repetition of these method steps are the following steps then added obtaining a second resulting signal by additive linking of the maximum value and minimum value in accordance with a rule of the form $V2=(Vmax-Vmin)*K2$, squaring the second resulting signal and
additive linking of the squared first resulting signal and the squared second resulting signal in accordance with a rule of the form $Va=K3*\{(1/8)*(K1/K2)^2*(V2)^2-(V1)^2\}$, by means of which the output signal is obtained.

The invention will be further described with reference to examples of embodiments shown in the drawings to which, however, the invention is not restricted.

Figure 1:
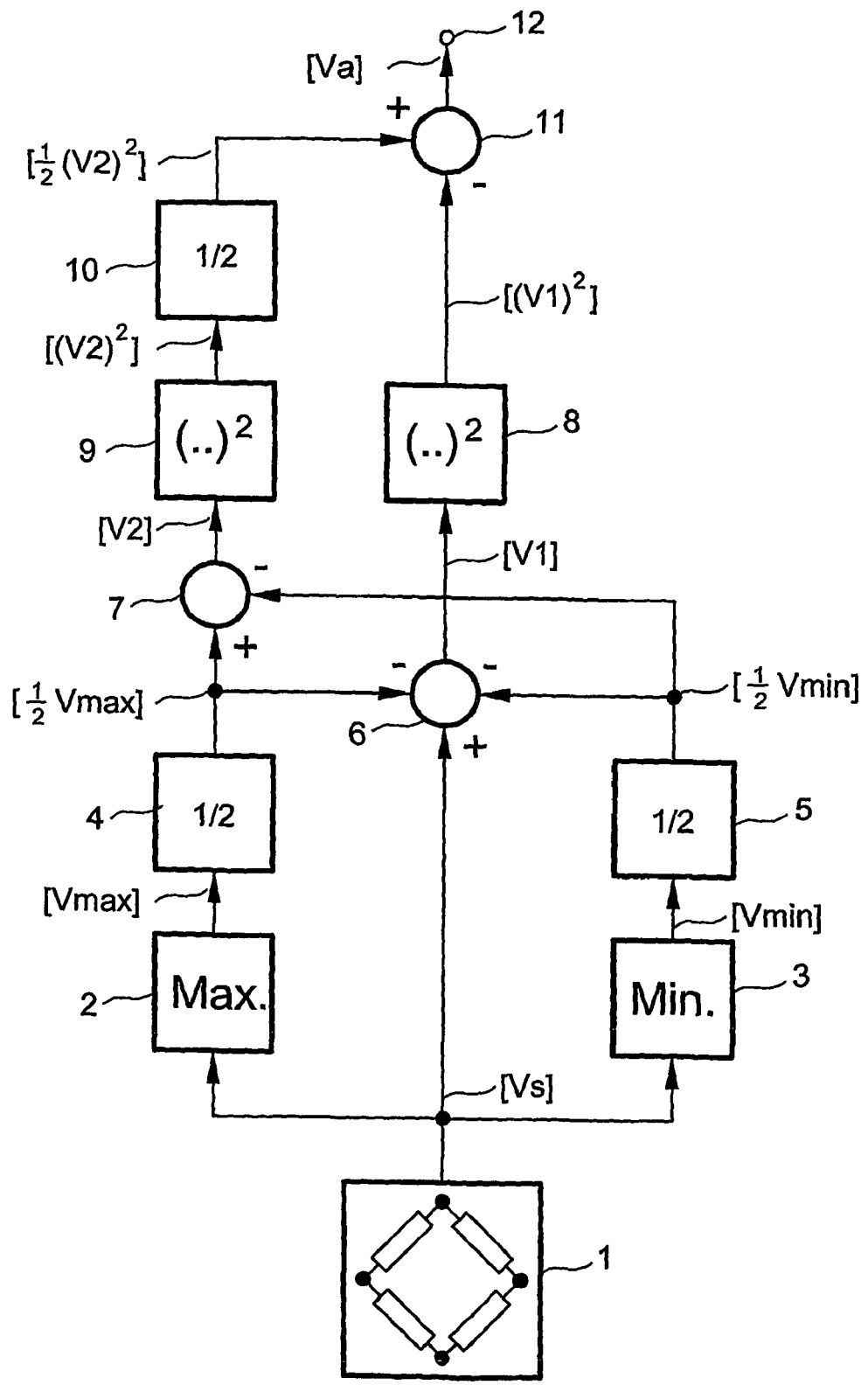
FIG. 1 shows a first, simple example of embodiment of the circuit arrangement according to the invention.

The first example of embodiment shown in FIG. 1 comprises a signal source 1, which is formed for example by a magnetoresistive sensor device designed as a Wheatstone bridge circuit and comprises four magnetic field-sensitive resistor elements, as is shown symbolically in the figure. The signal source 1 is connected to an input of a first peak value detection device 2, an input of a second peak value detection device 3 and a first input, designated by a symbol "+", of a first summer 6. The symbol "+" at the thus designated input of the first summer 6 means that a signal applied here is counted additively towards the output signal of the first summer 6. A signal Vs containing at least one alternating component is fed by the signal source 1 to said inputs. For the sake of clarity, the references of the signals that occur in the circuit arrangement are shown in square brackets in the figure.

The first peak value detection device 2 is designed in a manner known per se such that it determines the maximum value Vmax of the signal Vs, that is to say the positive peak value of the signal Vs at its input. This is output at its output.

The output is connected to an input of a circuit in which the signal values of a signal fed thereto are reduced by half. This circuit is therefore referred to herein below as the first halving circuit and bears the reference 4. The maximum value Vmax is fed to the first halving circuit 4 at its input; the halved signal value, i.e. ½*Vmax, is output at its output.

In a comparable manner, which is likewise known per se, the second peak value detection device 3 is designed such that it determines the minimum value Vmin of the signal Vs, that is to say the negative peak value of the signal Vs at its input. This is output at its output. The output is connected to an input of a second halving circuit 5 in which the signal values of a signal fed thereto are also reduced by half. The minimum value Vmin is fed to the second halving circuit 5 at its input; the halved signal value, i.e. ½*Vmin, is output at its output.

The output of the first halving circuit 4 is connected to a second input, designated by a symbol "−", of the first summer 6. The symbol "−" at the thus designated input of the first summer 6 means that a signal applied here is counted subtractively towards the output signal of the first summer 6. Correspondingly, the output of the second halving circuit 5 is connected to a third input, designated by a symbol "−", of the first summer 6, so that the signal applied here is likewise counted subtractively towards the output signal of the first summer 6.

In the example of embodiment shown in FIG. 1, the combination of first and second halving circuit 4 and 5 and first summer 6 is referred to as the first signal linking device. It is used to obtain a first resulting signal V1 in accordance with the rule $$V1 = Vs - (Vmax + Vmin)/2,$$

which is output at its output that is formed by an output of the first summer 6.

The output of the first summer 6 is connected to an input of a first squaring device 8 for squaring the first resulting signal V1; a signal that corresponds to the square (V1)² of the first resulting signal V1 is output at the output of said first squaring device.

The output of the first halving circuit 4 is furthermore connected to a first input, designated by a symbol "+", of a second summer 7. The signal ½*Vmax applied here is thus counted additively towards the output signal of the second summer 7. Correspondingly, the output of the second halving circuit 5 is connected to a second input, designated by a symbol "−", of the second summer 7, so that the signal ½*Vmin applied here is counted subtractively towards the output signal of the second summer 7.

In the present example of embodiment, the combination of first and second halving circuit 4 and 5 and second summer 7 is referred to as the second signal linking device. It is used to obtain a second resulting signal V2 in accordance with the rule $$V2 = (Vmax - Vmin)/2,$$

which is output at its output that is formed by an output of the second summer 7.

The output of the second summer 7 is connected to an input of a second squaring device 9 for squaring the second resulting signal V2; a signal that corresponds to the square (V2)² of the second resulting signal V2 is output at the output of said second squaring device.

The example of embodiment shown in FIG. 1 furthermore comprises a third signal linking device which is formed by a third halving circuit 10 and a third summer 11. In this case, an input of the third halving circuit 10 is connected to the output of the second squaring device 9. The signal that corresponds to the square (V2)² of the second resulting signal V2 is fed to the input of the third halving circuit 10. A signal having the signal value ½*(V2)² is therefore output at an output of the third halving circuit 10.

The output of the third halving circuit 10 is connected to a first input, designated by a symbol "+", of the third summer 11, so that the signal ½*(V2)² applied here is counted additively towards the output signal of the third summer 11. Correspondingly, the output of the first squaring device 8 is connected to a second input, designated by a symbol "−", of the third summer 11, so that the signal (V1)² applied here, which corresponds to the square of the first resulting signal V1, is counted subtractively towards the output signal of the third summer 11. The output signal of the third summer 11 is then formed by additive linking of the squared first resulting signal (V1)² and the squared second resulting signal (V2)² in accordance with the rule $$Va = ½*(V2)^2 - (V1)^2.$$

This output signal of the third summer 11 is made available at an output terminal 12 of the circuit arrangement as the output signal Va thereof.

In a modification of the circuit arrangement according to the example of embodiment described above, the third summer 11 may be replaced by a comparator circuit, the non-inverting input of which is fed the signal ½*(V2)² from the output of the third halving circuit 10 and the inverting input of which is fed the signal (V1)² from the output of the first squaring device 8. The output signal Va formed in accordance with said rule is then output at the output of the comparator circuit.

In a further modification of the example of embodiment shown in FIG. 1, the described combination consisting of the second summer 7, the second squaring device 9, the third halving circuit 10 and the third summer 11 may be replaced by an arrangement formed by the combination of first peak value detection device 2, second peak value detection device 3 and first signal linking device 4, 5, 6, the input of which arrangement is connected to the output of the first squaring device 8 and the output of which arrangement forms the output terminal 12 of the circuit arrangement. A removal of the constant components from the squared signal is also obtained thereby.

For a frequency multiplication that goes beyond a doubling of the frequency, the described circuit arrangement may furthermore be supplemented by further stages. By way of example, a configuration as shown in the figure between the output of the signal source 1 and the output terminal 12 may be added two or more times in a ladder network. In a modification of this development, it is also possible for only a number of stages as shown in the figure by the combination of first peak value detection device 2, second peak value detection device 3, first signal linking device 4, 5, 6 and first squaring device 8 to be added to one another in a ladder network.

Figure 2:
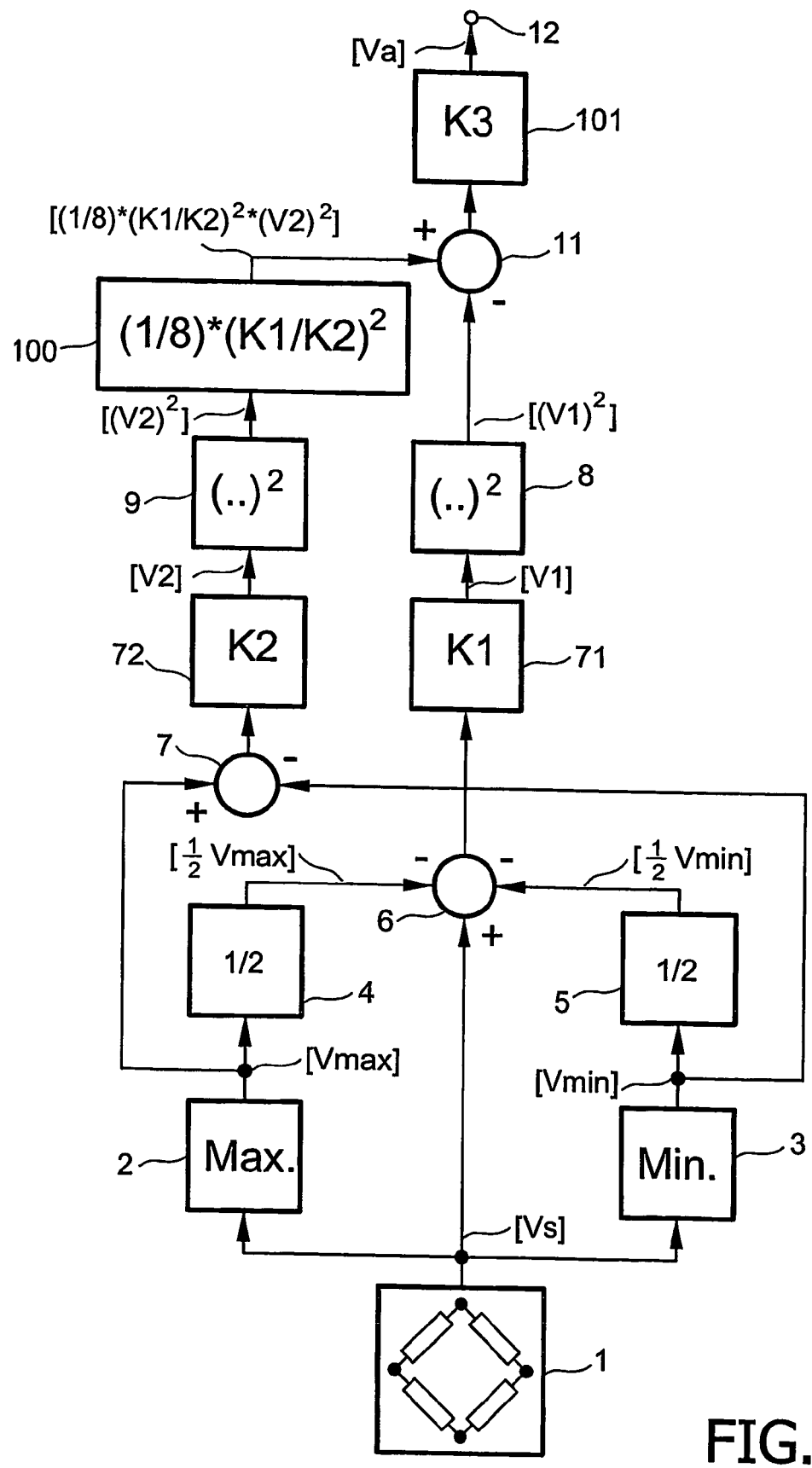
FIG. 2 shows a second, generalized example of embodiment of the circuit arrangement according to the invention.

FIG. 2 shows a second example of embodiment of the circuit arrangement according to the invention, in which the signal processing steps described up to now have been modified and freely selectable constant factors have been added to the signal paths and signal linking operations used to carry them out. Here, the circuit elements described in relation to the first example of embodiment shown in FIG. 1 are again provided with the same references.

In the example of embodiment shown in FIG. 2, there is connected downstream of the otherwise unchanged combination of first and second halving circuit 4 and 5 and first summer 6 a fourth amplification circuit 71, the input of which is connected to the output of the first summer 6 and which outputs at its output, amplified by a factor K1, a signal fed to its input. In this arrangement, the combination of first and second halving circuit 4 and 5, first summer 6 and fourth amplification circuit 71 forms the first signal linking device. It is used to obtain a first resulting signal V1 that is now formed in accordance with the rule $$V1=K1*\{Vs-(V\max+V\min)/2\},$$

which is output at the output of the first signal linking device 4, 5, 6, 71 that is formed by the output of the fourth amplification circuit 71.

The output of the fourth amplification circuit 71 is connected, in the manner already described with reference to FIG. 1, to the input of a first squaring device 8 for squaring the first resulting signal V1; a signal that corresponds to the square $(V1)^2$ of the first resulting signal V1 is output at the output of said first squaring device.

Furthermore, in FIG. 2, the output of the first peak value detection device 2 is directly connected to the first input, designated by the symbol "+", of the second summer 7. The signal Vmax applied here is thus counted additively towards the output signal of the second summer 7. Correspondingly, the output of the second peak value detection device 3 is directly connected to the second input, designated by the symbol "−", of the second summer 7, so that the signal Vmin applied here is counted subtractively towards the output signal of the second summer 7.

In the example of embodiment shown in FIG. 2, there is connected downstream of the second summer 7 a fifth amplification circuit 72, the input of which is connected to the output of the second summer 7 and which outputs at its output, amplified by a factor K2, a signal fed to its input. In this arrangement, the combination of second summer 7 and fifth amplification circuit 72 forms the second signal linking device. It is used to obtain a second resulting signal V2 that is now formed in accordance with the rule $$V2=(V\max-V\min)*K2,$$

which is output at the output of the second signal linking device 7, 72 that is formed by the output of the fifth amplification circuit 72.

The output of the fifth amplification circuit 72 is connected to an input of the second squaring device 9 for squaring the second resulting signal V2; a signal that corresponds to the square $(V2)^2$ of the second resulting signal V2 is output at the output of said second squaring device.

The factors K1 and K2 have any selectable constant values, which may even be less than 1.

In the circuit arrangement shown in FIG. 2, instead of the third halving circuit 10 there is an eighth amplification circuit 100, the input of which is connected to the output of the second squaring device 9 and in which the signal that corresponds to the square $(V2)^2$ of the second resulting signal V2 is accordingly multiplied by a factor $(1/8)*(K1/K2)^2$ that is now generally other than V2 by adding the factors K1 and K2 into the resulting signals V1 and V2. The signal $(1/8)*(K1/K2)^2*(V2)^2$ thus formed is output at the output of the eighth amplification circuit 100, which is now connected in place of the output of the third halving circuit 10 to the first output, designated by the symbol "+", of the third summer 11, so that the signal $(1/8)*(K1/K2)^2*(V2)^2$ applied here is counted additively towards the output signal of the third summer 11. The output of the first squaring device 8 is connected, unchanged, to the second input, designated by the symbol "−", of the third summer 11, so that also according to FIG. 2 the signal $(V1)^2$ that corresponds to the square of the first resulting signal V1 is counted subtractively towards the output signal of the third summer 11.

In the example of embodiment shown in FIG. 2, there is connected downstream of the third summer 11 a ninth amplification circuit 101, the input of which is connected to the output of the third summer 11 and which outputs at its output, amplified by a factor K3, a signal fed to its input. In this arrangement, the combination of the eighth amplification circuit 100, the third summer 11 and the ninth amplification circuit 101 forms the third signal linking device. It is used to obtain the signal formed by additive linking of the squared first resulting signal $(V1)^2$ and the squared second resulting signal $(V2)^2$ in accordance with the rule $$Va=K3*\{(1/8)*(K1/K2)^2*(V2)^2-(V1)^2\},$$

which is output at the output of the third signal linking device 100, 11, 101 that is formed by the output of the ninth amplification circuit 101. This output signal of the ninth amplification circuit 101 is made available at the output terminal 12 of the circuit arrangement as the output signal Va thereof.

If, in the above-described second example of embodiment, the values $$K1=1, K2=1/2, K3=1$$

are selected for the constant factors K1, K2, K3 and if in the circuit arrangement of FIG. 2 the fifth amplification circuit 72 is combined with the first and second halving circuit 4, 5, the circuit arrangement and dimensioning of the first example of embodiment of FIG. 1 are again obtained.

Figure 3:
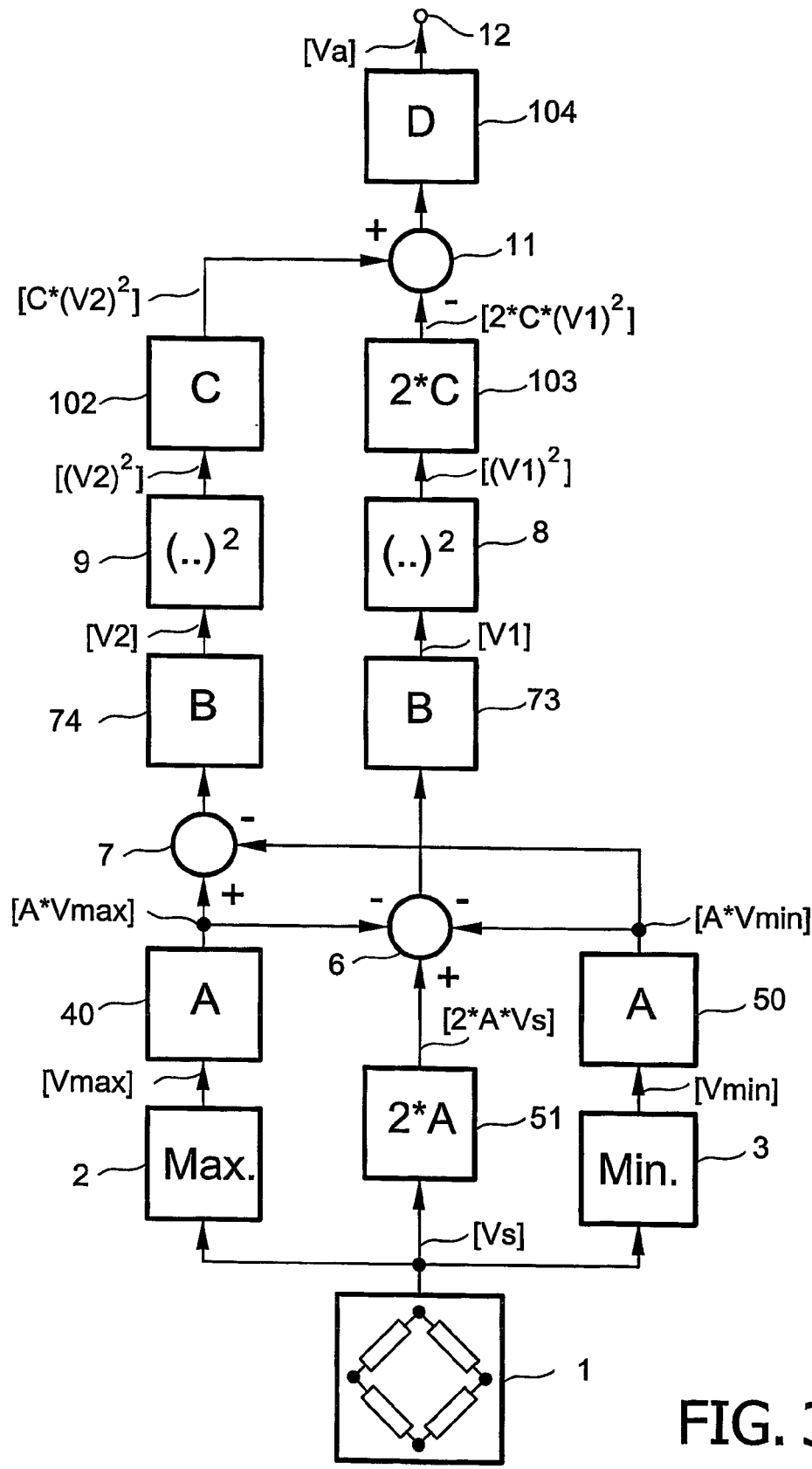
FIG. 3 shows a third, generalized example of embodiment of the circuit arrangement according to the invention.

FIG. 3 shows a third example of embodiment of the circuit arrangement according to the invention, in which the signal processing steps described with reference to FIG. 1 have been modified in a different way and freely selectable amplification factors have been added to the signal paths and signal linking operations used to carry them out. Here, the circuit elements described in relation to the first example of embodiment shown in FIG. 1 are again provided with the same references.

The output of the first peak value detection device 2 is now connected to an input of a first amplification circuit 40, in which the signal values of a signal fed thereto are amplified, that is to say multiplied, by a freely selectable first amplification factor A. The maximum value Vmax is fed to the first amplification circuit 40 at its input; the signal value multiplied by A, i.e. A*Vmax, is output at its output. In the same way, the output of the second peak value detection device 3 is connected to an input of a second amplification circuit 50, in which the signal values of a signal fed thereto are likewise multiplied by the first amplification factor A. The minimum value Vmin is fed to the second amplification circuit 50 at its input; the signal value multiplied by A, i.e. A*Vmin, is output at its output.

In FIG. 3, the signal source 1 is connected to an input of a third amplification circuit 51, in which the signal values of a signal fed thereto are multiplied by twice the first amplification factor A, that is to say by 2*A. The signal Vs containing at least one alternating component is fed to the third amplification circuit 51 at its input; the signal value multiplied by 2*A, i.e. 2*A*Vs, is output at its output.

The output of the third amplification circuit 51 is connected to the first input, designated by the symbol "+", of the first summer 6, whereas the output of the first amplification circuit 40 is connected to the second input, designated by the symbol "−", of the first summer 6 and the output of the second amplification circuit 50 is connected to the third input, likewise designated by the symbol "−", of the first summer 6. This means that a signal formed in accordance with the rule $$2*A*Vs-A*V\max-A*V\min$$

is output at the output of the first summer 6. Connected downstream of the first summer 6 is a sixth amplification circuit 73, the input of which is connected to the output of the first summer 6 and which outputs at its output, amplified by a freely selectable second amplification factor B, a signal fed to its input. In this arrangement, the combination of first, second and third amplification circuit 40, 50 and 51, first summer 6 and sixth amplification circuit 73 forms the first signal linking device. It is used to obtain the first resulting signal V1 that is now formed in accordance with the rule $$V1=B*[2*A*Vs-A*V\max-A*V\min]=2*A*B*\{Vs-(V\max+V\min)/2\},$$

which is output at the output of the first signal linking device 40, 50, 51, 6, 73 that is formed by the output of the sixth amplification circuit 73.

The output of the sixth amplification circuit 73 is connected to the input of the first squaring device 8 for squaring the first resulting signal V1; the signal that corresponds to the square $(V)^2$ of the first resulting signal V1 is output at the output of said first squaring device.

The output of the first amplification circuit 40 is furthermore connected to the first input, designated by the symbol "+", of the second summer 7. The signal A*Vmax applied here is thus counted additively towards the output signal of the second summer 7. Correspondingly, the output of the second amplification circuit 50 is connected to the second input, designated by the symbol "−", of the second summer 7, so that the signal A*Vmin applied here is counted subtractively towards the output signal of the second summer 7.

Connected downstream of the second summer 7 is a seventh amplification circuit 74, the input of which is connected to the output of the second summer 7 and which outputs at its output, likewise amplified by the second amplification factor B, a signal fed to its input. In this case, the combination of first and second amplification circuit 40 and 50, second summer 7 and seventh amplification circuit 74 forms the second signal linking device. It is used to obtain the second resulting signal V2 that is now formed in accordance with the rule $$V2=B*[A*V\max-A*V\min]=A*B*(V\max-V\min),$$

which is output at the output of the second signal linking device 40, 50, 7, 74 that is formed by the output of the seventh amplification circuit 74.

The output of the seventh amplification circuit 74 is connected to the input of the second squaring device 9 for squaring the second resulting signal V2; the signal that corresponds to the square $(V2)^2$ of the second resulting signal V2 is output at the output of said second squaring device.

The example of embodiment shown in FIG. 3 furthermore comprises a third signal linking device, which is formed by a tenth amplification circuit 102, an eleventh amplification circuit 103, the third summer 11 and a twelfth amplification circuit 104.

In this case, an input of the tenth amplification circuit 102 is connected to the output of the second squaring device 9. The signal that corresponds to the square $(V2)^2$ of the second resulting signal V2 is fed to the input of the tenth amplification circuit 102. The tenth amplification circuit 102 outputs at its output, amplified by a freely selectable third amplification factor C, a signal fed to its input. A signal having the signal value $C*(V2)^2$ is therefore output at the output of the tenth amplification circuit 102.

An input of the eleventh amplification circuit 103 is connected to the output of the first squaring device 8. The signal that corresponds to the square $(V1)^2$ of the first resulting signal V1 is fed to the input of the eleventh amplification circuit 103. The eleventh amplification circuit 103 outputs at its output, amplified by an amplification factor 2*C, a signal fed to its input, where C is the freely selectable third amplification factor of the tenth amplification circuit 102. A signal having the signal value $2*C*(V1)^2$ is therefore output at the output of the eleventh amplification circuit 103.

The output of the tenth amplification circuit 102 is connected to the first input, designated by the symbol "+", of the third summer 11, so that the signal $C*(V2)^2$ applied here is counted additively towards the output signal of the third summer 11. Correspondingly, the output of the eleventh amplification circuit 103 is connected to the second input, designated by the symbol "−", of the third summer 11, so that the signal $2*C*(V1)^2$ applied here is counted subtractively towards the output signal of the third summer 11. The output signal of the third summer 11 is then formed by additive linking of the signals $C*(V2)^2$ and $2*C*(V1)^2$ from the outputs of the tenth and eleventh amplification circuits 102 and 103 in accordance with the rule $$C*(V2)^2-2*C*(V1)^2.$$

Connected downstream of the third summer 11 is the twelfth amplification circuit 104, the input of which is connected to the output of the third summer 11 and which outputs at its output, amplified by a freely selectable fourth amplification factor D, a signal fed to its input. The output of the twelfth amplification circuit 104 forms the output of the third signal linking device 102, 103, 11, 104 and is connected to the output terminal 12 of the circuit arrangement. The signal formed in accordance with the rule $$Va=D*\{C*(V2)^2-2*C*(V1)^2\}=2*C*D*\{(\tfrac{1}{2})*(V2)^2-(V1)^2\}$$

is then made available at the output terminal 12 as the output signal Va of the circuit arrangement.

By comparing $$K1=2*A*B, K2=A*B \text{ and } K3=2*C*D,$$

it can be seen that the circuit arrangements of the examples of embodiments shown in FIGS. 2 and 3 ultimately lead to the same result upon processing of the signals fed to them. By selecting the values $$A=\tfrac{1}{2}, B=1, C=\tfrac{1}{2} \text{ and } D=1$$

for the first to fourth amplification factors A to D and an associated simplification of the circuit, there is once again a transition from the generalized example of embodiment of FIG. 3 to the simple circuit arrangement of FIG. 1.

The signal processing devices described may be designed as analog or digital computation circuits or as programmed arithmetic units.

LIST OF REFERENCES

1 signal source
2 first peak value detection device
3 second peak value detection device
4 first halving circuit
5 second halving circuit
6 first summer
(4, 5, 6) first signal linking device 7 second summer
(4, 5, 7) second signal linking device
8 first squaring device
9 second squaring device
10 third halving circuit
11 third summer
(10, 11) third signal linking device
12 output terminal
40 first amplification circuit
50 second amplification circuit
51 third amplification circuit
71 fourth amplification circuit
72 fifth amplification circuit
73 sixth amplification circuit
74 seventh amplification circuit
100 eighth amplification circuit
101 ninth amplification circuit
102 tenth amplification circuit
103 eleventh amplification circuit
104 twelfth amplification circuit
A freely selectable first amplification factor (for 40, 50, 51)
B freely selectable second amplification factor (for 73, 74)
C freely selectable third amplification factor (for 102, 103)
D freely selectable fourth amplification factor (for 104)
K1 freely selectable first constant factor (for 71, 100)
K2 freely selectable second constant factor (for 72, 100)
K3 freely selectable third constant factor (for 101)
Vs signal containing at least one alternating component
Va output signal
Vmin minimum value of the signal Vs
Vmax maximum value of the signal Vs
V1 first resulting signal
V2 second resulting signal

The invention claimed is:

1. A circuit arrangement for obtaining an output signal from a signal containing at least one alternating component, said circuit arrangement comprising
a signal source that supplies this signal,
a first peak value detection device for determining a maximum value (Vmax) of the signal,
a second peak value detection device for determining a minimum value of the signal,
a first signal linking device for obtaining a first resulting signal by additive linking of the signal, the maximum value and the minimum value in accordance with the rule $V1 = K1 * \{Vs - (V\max = V\min)/2\}$, in which K1 is a freely selectable first constant factor, a second signal linking device for obtaining a second resulting signal by additive linking of the maximum value and minimum value (Vmin) in accordance with the rule $V2 = (V\max - V\min) * K2$, in which K2 is a freely selectable second constant factor,
a first squaring device for squaring the first resulting signal,
a second squaring device for squaring the second resulting signal and a third signal linking device for obtaining the output signal by additive linking of the squared first resulting signal and the squared second resulting signal in accordance with the rule $Va = K3 * \{(1/8) * (K1/K2)^2 * (V2)^2 - (V1)^2\}$, in which K3 is a freely selectable third constant factor.

2. A circuit arrangement as claimed in claim 1, characterized in that the signal source is formed by a sensor device.

3. A circuit arrangement as claimed in claim 2, characterized in that the sensor device is designed as a magnetoresistive sensor device.

4. A rotational speed measurement device, characterized by a circuit arrangement as claimed in claim 1.

5. A method of measuring rotational speed of an object, the method comprising:
obtaining a signal containing at least one alternating component;
determining a maximum value of the signal,
determining a minimum value of the signal,
obtaining a first resulting signal by additive linking of the signal, the maximum value and the minimum value in accordance with the rule $V1 = K1 * \{Vs - (V\max = V\min)/2\}$, in which K1 is a freely selectable first constant factor,
obtaining a second resulting signal by additive linking of the maximum value and minimum value in accordance with the rule $V2 = (V\max - V\min) * K2$, in which K2 is a freely selectable second constant factor,
squaring the first resulting signal,
squaring the second resulting signal,
obtaining the output signal by additive linking of the squared first resulting signal and the squared second resulting signal in accordance with the rule $Va = K3 * \{(1/8) * (K1/K2)^2 * (V2)^2 - (V1)^2\}$, in which K3 is a freely selectable third constant factor; and
generating a rotational speed measurement as a function of the output signal.

* * * * *